United States Patent
Cho et al.

(10) Patent No.: US 8,723,200 B2
(45) Date of Patent: May 13, 2014

(54) LEAD FRAME, LIGHT EMITTING DIODE HAVING THE LEAD FRAME, AND BACKLIGHT UNIT HAVING THE LIGHT EMITTING DIODE

(75) Inventors: Jae-Ho Cho, Seoul (KR); Sean-Jhin Yoon, Incheon (KR); Tae-Kwang Kim, Seoul (KR); Kyung-Nam Kim, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/828,633

(22) Filed: Jul. 1, 2010

(65) Prior Publication Data

US 2010/0315835 A1    Dec. 16, 2010

Related U.S. Application Data

(62) Division of application No. 12/351,480, filed on Jan. 9, 2009, now Pat. No. 8,288,785.

(30) Foreign Application Priority Data

Dec. 3, 2008  (KR) ............................... 2008-122152
Dec. 18, 2008 (KR) ............................... 2008-129036

(51) Int. Cl.
  *H01L 33/00*   (2010.01)
(52) U.S. Cl.
  USPC ............................................. 257/98; 257/99
(58) Field of Classification Search
  USPC ........... 257/678, 736, 734, 762, 781, 666, 98, 257/99
  See application file for complete search history.

(56) References Cited

U.S. PATENT DOCUMENTS

| | | | |
|---|---|---|---|
| 4,475,794 A | | 10/1984 | Baker et al. |
| 4,713,824 A | | 12/1987 | Heller |
| 5,889,317 A | * | 3/1999 | Huang et al. .................. 257/666 |
| 5,959,316 A | | 9/1999 | Lowery |
| 6,232,651 B1 | * | 5/2001 | Lee et al. ....................... 257/666 |
| 6,680,568 B2 | | 1/2004 | Fujiwara et al. |
| 6,998,649 B2 | | 2/2006 | Hata |

(Continued)

FOREIGN PATENT DOCUMENTS

| | | |
|---|---|---|
| CA | 875093 | 7/1971 |
| EP | 0116173 | 8/1984 |

(Continued)

OTHER PUBLICATIONS

Non-Final Office Action issued in co-pending U.S. Appl. No. 12/351,480 dated Sep. 16, 2010.

(Continued)

*Primary Examiner* — Bilkis Jahan
(74) *Attorney, Agent, or Firm* — H.C. Park & Associates, PLC

(57) ABSTRACT

An LED includes a light-emitting chip, a metal member, and a housing. The light-emitting chip generates light. The light-emitting chip is arranged on the metal member. The housing is combined with the metal member to fix the metal member. The housing has an opening portion exposing at least a portion of the light-emitting chip and the metal member. The metal member includes a base metal layer, a light-reflecting layer arranged on the base metal layer, and a protection layer arranged on the light-reflecting layer and including a metal.

18 Claims, 13 Drawing Sheets

(56) References Cited

U.S. PATENT DOCUMENTS

| | | | |
|---|---|---|---|
| 2003/0011048 A1* | 1/2003 | Abbott et al. | 257/666 |
| 2003/0107316 A1 | 6/2003 | Murakami et al. | |
| 2004/0065894 A1 | 4/2004 | Hashimoto et al. | |
| 2004/0217369 A1 | 11/2004 | Nitta et al. | |
| 2006/0163601 A1 | 7/2006 | Harle et al. | |
| 2007/0008739 A1* | 1/2007 | Kim et al. | 362/612 |
| 2007/0194336 A1 | 8/2007 | Shin et al. | |
| 2007/0298543 A1* | 12/2007 | Su et al. | 438/122 |
| 2008/0048201 A1 | 2/2008 | Kim et al. | |
| 2008/0217640 A1* | 9/2008 | Suzuki et al. | 257/98 |
| 2009/0296384 A1 | 12/2009 | Van de Ven et al. | |
| 2010/0078669 A1 | 4/2010 | Cho et al. | |

FOREIGN PATENT DOCUMENTS

| | | |
|---|---|---|
| JP | 2004-153277 | 5/2004 |
| JP | 2007-073575 | 3/2007 |
| JP | 2007-080899 | 3/2007 |
| JP | 2007-158296 | 6/2007 |
| JP | 2007-258647 | 10/2007 |
| JP | 2007-311253 | 11/2007 |
| JP | 2008-147511 | 6/2008 |
| JP | 2008-210691 | 9/2008 |
| JP | 2008-283221 | 11/2008 |
| WO | 99/64900 | 12/1999 |

OTHER PUBLICATIONS

Final Office Action issued Feb. 18, 2011 in co-pending U.S. Appl. No. 12/351,480.

Non-Final Office Action issued on Jan. 20, 2012 in U.S. Appl. No. 12/351,480.

Notice of Allowance issued on Jun. 18, 2012 in U.S. Appl. No. 12/351,480.

European Patent Office, Extended European Search Report for Application No./Patent No. 09000789.9-1551 / 2194589 dated Mar. 27, 2013.

* cited by examiner

LEAD FRAME, LIGHT EMITTING DIODE HAVING THE LEAD FRAME, AND BACKLIGHT UNIT HAVING THE LIGHT EMITTING DIODE

CROSS REFERENCE TO RELATED APPLICATION

This application is a divisional of U.S. patent application Ser. No. 12/351,480, filed Jan. 9, 2009, and claims priority from and the benefit of Korean Patent Application No. 2008-122152, filed on Dec. 3, 2008, and Korean Patent Application No. 2008-129036, filed on Dec. 18, 2008, which are hereby incorporated by reference for all purposes as if fully set forth herein.

BACKGROUND OF THE INVENTION

1. Field of the Invention

The present invention relates to a lead frame, a light emitting diode having the lead frame, and a backlight unit having the light emitting diode. More particularly, the present invention relates to a lead frame of high optical reflectivity and reliability, a light emitting diode having the lead frame, and a backlight unit having the light emitting diode.

2. Discussion of the Background

In general, a light emitting diode (LED) converts electric energy into light by using compound semiconductor. The LED has merits such as a high efficiency, a long life span, and low power consumption. Furthermore, the LED is eco-friendly. Therefore, the LED may be used in various fields.

The LED may be formed by packaging a light-emitting chip mounted on a lead frame. When electric power is applied to the light-emitting chip through the lead frame, the light-emitting chip emits light.

According to a conventional LED, a lead frame coated with silver (Ag) is used in order to enhance light reflectivity. However, the lead frame coated with silver (Ag) may be vulnerable to moisture and heat, so that when the LED is used for a long time, the lead frame is corroded and darkened to lower luminance and shorten life span. In order to solve the corrosion problem, a lead frame coated with gold (Au) instead of silver was developed, but gold (Au) has relatively low light reflectivity that may lower efficiency of an LED.

SUMMARY OF THE INVENTION

The present invention provides a lead frame having high reflectivity while minimizing corrosion and discoloration.

The present invention also provides a light emitting diode (LED) having the lead frame to have high reflectivity.

The present invention also provides a backlight unit having the LED.

Additional features of the invention will be set forth in the description which follows, and in part will be apparent from the description, or may be learned by practice of the invention.

The present invention discloses a lead frame including a base metal layer, a light-reflecting layer, and a protection layer. The light-reflecting layer is arranged on the base metal layer. The protection layer is arranged on the light-reflecting layer and includes a metal.

The present invention also discloses an LED including a light-emitting chip, a metal member, and a housing. The light-emitting chip generates light. The light-emitting chip is arranged on the metal member. The housing is combined with the metal member to fix the metal member. The housing has an opening portion exposing at least a portion of the light-emitting chip and the metal member. The metal member includes a base metal layer, a light-reflecting layer arranged on the base metal layer, and a protection layer arranged on the light-reflecting layer and including a metal.

The present invention also discloses a backlight unit including a light guide plate and at least one light emitting diode (LED) providing the light guide plate with light. The LED includes a lead frame including a base metal layer, a light-reflecting layer arranged on the base metal layer, and a protection layer arranged on the light-reflecting layer and including a metal, and a light-emitting chip mounted on the lead frame. The light-reflecting layer includes silver (Ag) or aluminum (Al). The protection layer includes gold (Au), nickel (Ni), or titanium (Ti).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
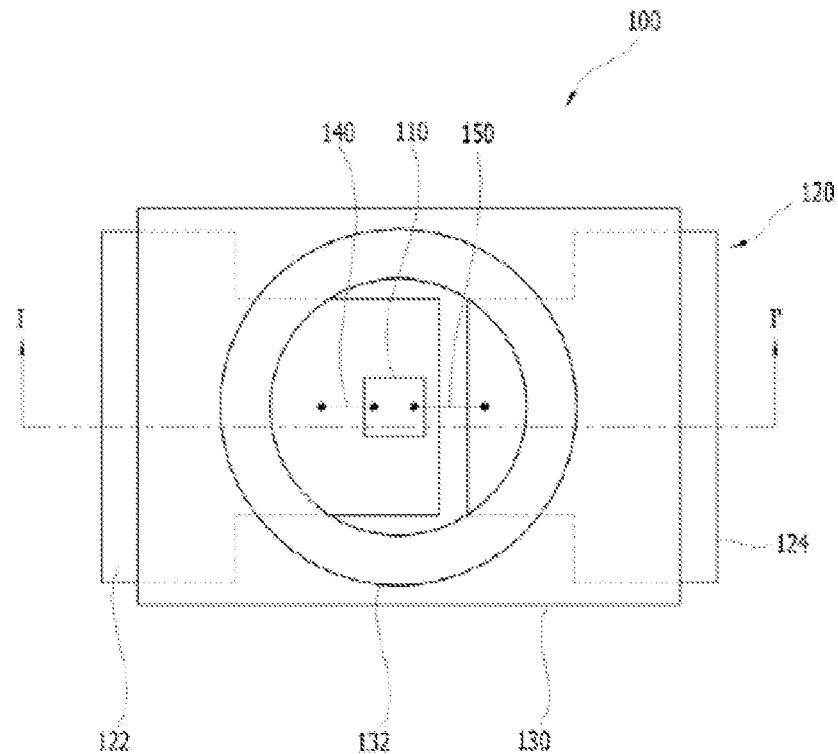
FIG. 1 is a plan view showing a light emitting diode according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

Figure 2:
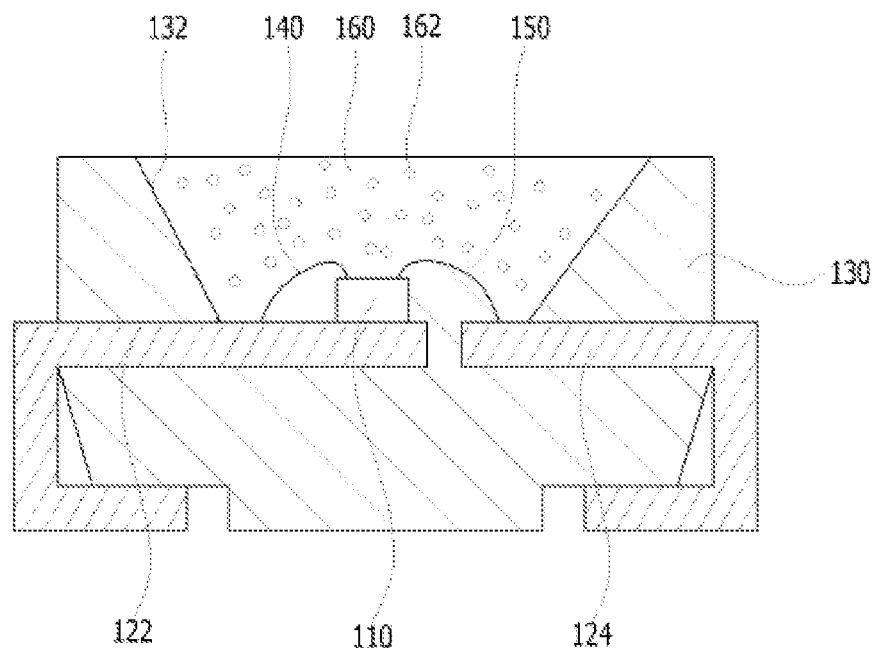
FIG. 2 is a cross-sectional view taken along line I-I' in FIG. 1.

FIG. 1 is a plan view showing a light emitting diode according to an exemplary embodiment of the present invention. FIG. 2 is a cross-sectional view taken along line I-I' in FIG. 1, and FIG. 3 is an enlarged view showing a lead frame in FIG. 2.

Figure 3:
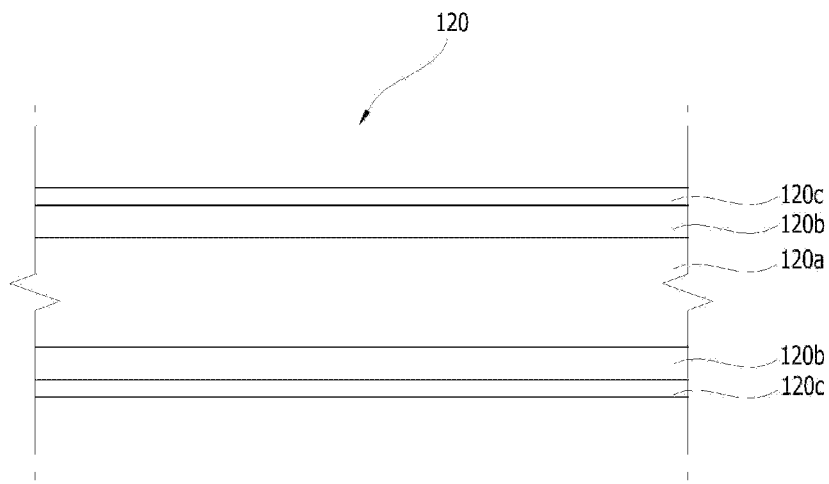
FIG. 3 is an enlarged view showing a lead frame in FIG. 2.

Referring to FIG. 1, FIG. 2, and FIG. 3, a light emitting diode (LED) 100 according to an exemplary embodiment of the present invention includes a light-emitting chip 110, a metal member 120 on which the light-emitting chip 110 is mounted, and a housing 130 combined with the metal member 120 to fix the metal member 120. Additionally, the LED 100 may further include first and second conductive wires 140 and 150 electrically connecting the light-emitting chip 110 to the metal member 120, and an encapsulant filled in an opening portion 132 of the housing 130.

In the present exemplary embodiment, the metal member 120 on which the light-emitting chip 110 is mounted is embodied by a lead frame for applying electric power to the light-emitting chip 110. For convenience, the same numeral will be used for the lead frame and the metal member 120.

The lead frame 120 supports the light-emitting chip 110, and receives electric power to provide the light-emitting chip 110 with the electric power.

The lead frame 120 may include a first lead terminal 122 and a second lead terminal 124 spatially and electrically separated from each other. The light-emitting chip 110 is mounted on, for example, the first lead terminal 122.

The first and second lead terminals 122 and 124 may be electrically connected to the light-emitting chip 110 through the first and second conducting wires 140 and 150, respectively. The first lead terminal 122 may be electrically connected to the light-emitting chip 110 through conductive adhesive. Portions of the first and second lead terminals 122 and 124 are exposed out of the housing 130 to be electrically connected to an external circuit board.

The lead frame 120 includes a base metal layer 120a, a light-reflecting layer 120b formed on a surface of the base metal layer 120a, and a protection layer 120c formed on a surface of the light-reflecting layer 120b as shown in FIG. 3.

The base metal layer 120a includes metal with high electrical conductivity and processibility. For example, the base metal layer 120a includes copper (Cu), or copper alloy with copper (Cu) and zinc (Zn), or copper alloy with copper (Cu) and iron (Fe). The base metal layer 120a has a thickness of about 0.1 mm to about 1.0 mm.

The light-reflecting layer 120b includes metal of high light reflectivity for enhancing light reflectivity of the lead frame 120. For example, the light-reflecting layer 120b includes silver (Ag) or aluminum (Al). The light-reflecting layer 120b may be formed on the surface of the base metal layer 120a through a plating method. When a thickness of the light-reflecting layer 120b increases, the light reflectivity is improved. However, manufacturing cost may also increase. Therefore, the thickness of the light-reflecting layer 120b is determined in consideration of the light reflectivity and the manufacturing cost. For example, the light-reflecting layer 120b having a thickness of about 1 µm to about 50 µm is formed on the surface of the base metal layer 120a.

The protection layer 120c is formed on the surface of the light-reflecting layer 120b to protect the light-reflecting layer 120b from corrosion. The light-reflecting layer 120b formed on the base metal layer 120a has high light reflectivity but the light-reflecting layer 120b is vulnerable to moisture and heat to be easily corroded and darkened. Therefore, in order to prevent the light-reflecting layer 120b from being corroded and darkened, the protection layer 120c is formed on the surface of the light-reflecting layer 120b.

The protection layer 120c includes a diffusion barrier metal even though the diffusion barrier metal has a relatively lower light-reflectivity than the light-reflecting layer 120b. For example, the protection layer 120c includes gold (Au), nickel (Ni), or titanium (Ti). The protection layer 120c including gold (Au), nickel (Ni), or titanium (Ti) may be formed through a plating method. In detail, the protection layer 120c may be formed through an electrolytic plating method using solution providing gold (Au), nickel (Ni), or titanium (Ti) ions, or the protection layer 120c may be formed through an electroless plating method using a mixture of electrolytic solution providing gold (Au), nickel (Ni), or titanium (Ti) ions, a reducing agent such as dimethylaminboran (DMAB) or EDTA standard solution and an anticorrosive agent to form gold (Au) layer, nickel (Ni) layer, or titanium (Ti) layer. Alternatively, the protection layer 120c including gold (Au), nickel (Ni), or titanium (Ti) may be formed through a sputtering method.

When the thickness of the protection layer 120c increases, a function for protecting the light-reflecting layer 120b from chemical attack is improved but light reflectivity is lowered to lower luminance of the LED 100. On the contrary, when the thickness of the protection layer 120c decreases, the light reflectivity is improved but a function of the protection layer 120c may be deteriorated. Therefore, it is important to determine the optimal thickness of the protection layer 120c protecting the light-reflecting layer 120b, while minimizing deterioration of the light reflectivity of the light-reflecting layer 120b.

Figure 4:
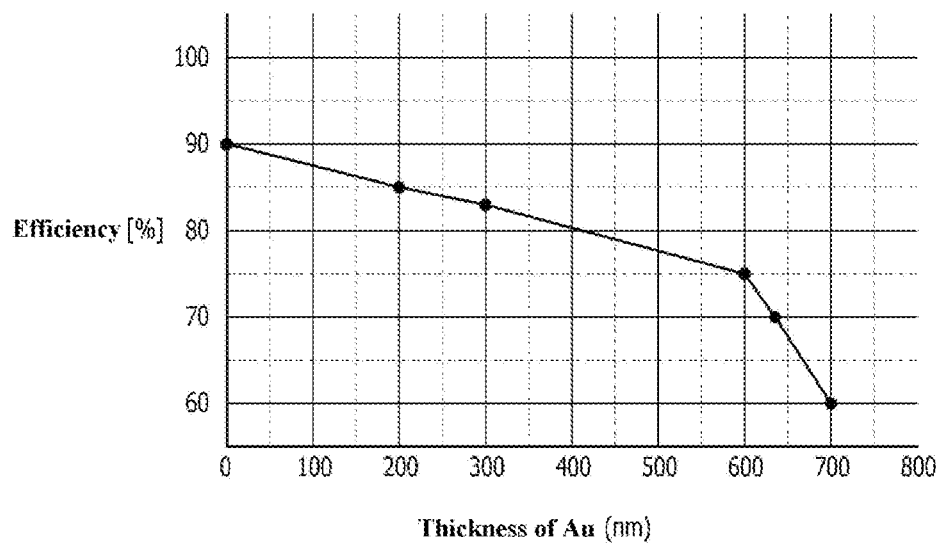
FIG. 4 is a graph showing a relationship between a thickness of the protection layer of gold (Au) and efficiencies of the light emitting diode in FIG. 1.

FIG. 4 is a graph showing a relationship between a thickness of the protection layer of gold (Au) and efficiencies of the light emitting diode in FIG. 1. In FIG. 4, the y-axis shows an efficiency corresponding to a thickness of protection layer including gold (Au), when a conventional light-reflecting layer without the protection layer and the package (in detail the encapsulant 160 in FIG. 1) corresponds to an efficiency of 100%. In FIG. 4, the thickness of the light-reflecting layer is fixed to be about 3 µm.

Referring to FIG. 3 and FIG. 4, when the thickness of the protection layer 120c, which is formed on the light-reflecting layer 120b having about 3 µm thickness, is substantially equal to or less than about 2 nm, the efficiency is about 90%. When the thickness of the protection layer 120c is about 200 nm, the efficiency is about 85%. When the thickness of the protection layer 120c is about 300 nm, the efficiency is about 83%. When the thickness of the protection layer 120c is about 600 nm, the efficiency is about 75%. When the thickness of the protection layer 120c is about 640 nm, the efficiency is about 70%, and when the thickness of the protection layer 120c is about 700 nm, the efficiency is about 60%. As shown in FIG. 4, the efficiency is rapidly decreased when the thickness of the protection layer 120c is over about 600 nm. Furthermore, when the thickness of the lead frame 120 arrives at 700 nm, the efficiency is dropped to be about 60% of the original efficiency.

Therefore, when the thickness of the protection layer 120c, which includes gold (Au) and is formed on the light-reflecting layer 120b, is in a range of about 0.1 nm, which is the minimum thickness of the protection layer 120c capable of protecting the light-reflecting layer 120b, to about 600 nm, which is maximum thickness of the protection layer 120c capable of maintaining the efficiency more than about a specific level, the efficiency of the LED 100 is over about 75%.

Figure 5:
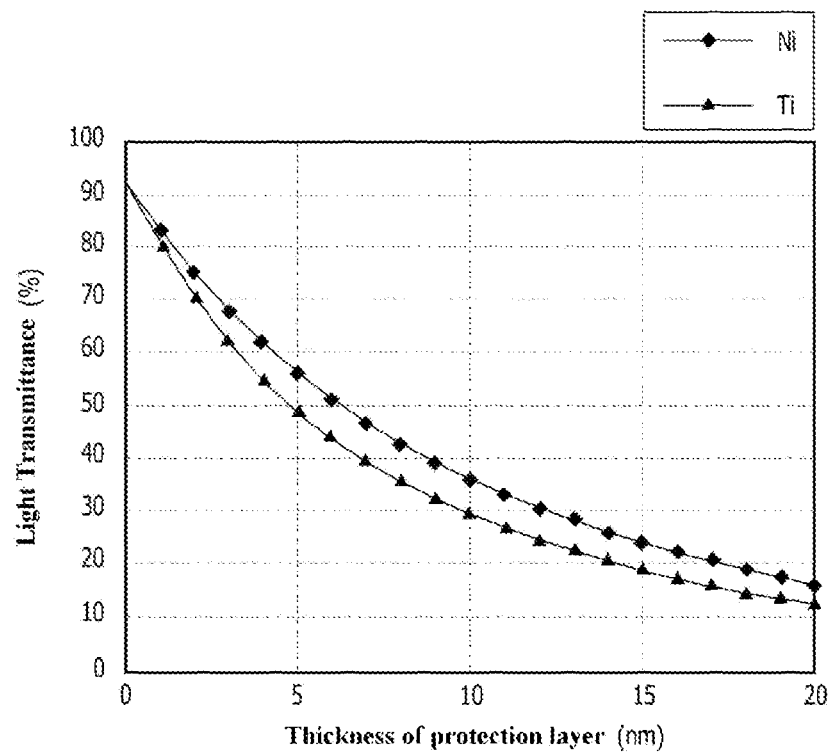
FIG. 5 is a graph showing a relationship between a thickness of the protection layer of nickel (Ni) and titanium (Ti) and light transmittances.

FIG. 5 is a graph showing a relationship between a thickness of the protection layer of nickel (Ni) and titanium (Ti), and light transmittances.

Referring to FIG. 3 and FIG. 5, light passing through the protection layer 120c is reflected by the light-reflecting layer 120b having relatively high light reflectivity. Therefore, when light transmittance of the protection layer 120c becomes higher, the light reflectivity of the lead frame 120 becomes higher. When the thickness of the nickel (Ni) layer or titanium (Ti) layer operating as the protection layer 120c increases, the light transmittance decreases. However, even when the thickness of nickel (Ni) layer or titanium (Ti) layer is about 20 nm, the light transmittance is over about 10%. As the thickness of the protection layer 120c increases, the light reflectivity of the lead frame 120 decreases but function of the protection layer 120c becomes better. Therefore, the reflectivity of the lead frame 120 becomes better in comparison with the light-reflecting layer 120b, on which no protection layer is formed to be corroded and darkened.

In other words, when the thickness of the protection layer 120c, which includes nickel (Ni) and titanium (Ti) and is formed on the light-reflecting layer 120b, is in a range of about 0.1 nm which is the minimum thickness of the protection layer 120c capable of protecting the light-reflecting layer 120b, to about 20 nm which is maximum thickness of the protection layer 120c capable of maintaining the efficiency more than about a specific level, the light-reflecting layer 120b is prevented from being corroded and darkened while maintaining the light reflectivity of the lead frame 120.

The light-reflecting layer 120b and the protection layer 120c may be formed on both of the upper and lower surfaces of the lead frame 120. Alternatively, the light-reflecting layer 120b and the protection layer 120c may be formed on one of the upper and lower surfaces of the lead frame 120, or portions of the lead frame 120, on which the light-reflecting layer 120b and the protection layer 120c are required to be formed.

Figure 6:
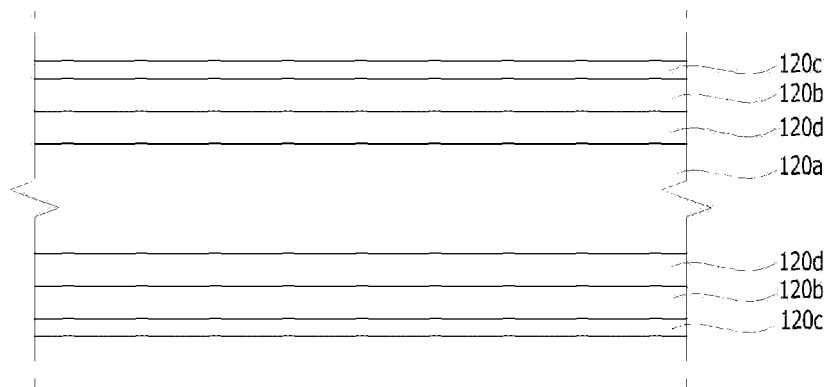
FIG. 6 is a cross-sectional view showing a lead frame according to another exemplary embodiment of the present invention.

FIG. 6 is a cross-sectional view showing a lead frame according to another exemplary embodiment of the present invention. The lead frame in FIG. 6 is substantially the same as the lead frame in FIG. 3, except for a nickel layer. Thus, same reference numerals will be used for the same elements, and any further explanation will be omitted.

Referring to FIG. 6, a lead frame 120 may further include a nickel layer 120d disposed between the base metal layer 120a and the light-reflecting layer 120b. As shown in FIG. 6, when the nickel layer 120d is formed on base metal layer 120a, the light-reflecting layer 120b is formed on the nickel layer 120d, and the protection layer 120c is formed on the light-reflecting layer 120b, the same light reflectivity may be obtained as shown in FIG. 3. When the nickel layer 120d which may have a lower price than silver (Ag), is firstly formed before the light-reflecting layer 120b including silver (Ag), a thickness of the light-reflecting layer 120b may be reduced to lower a manufacturing cost.

Referring again to FIG. 1 and FIG. 2, the light-emitting chip 110 is mounted on the lead frame 120, and the light-emitting chip 110 generates light when the light-emitting chip 110 receives electric power through the lead frame 120. For example, the light-emitting chip 110 is mounted on the first lead terminal 122, and the light-emitting chip 110 is electrically connected to the first and second lead terminals 122 and 124 through the first and second conducting wires 140 and 150, respectively. The light-emitting chip 110 includes a semiconductor such as, for example, gallium nitride (GaN), gallium arsenic nitride (GaAsN), or indium nitride (IN), etc. The light-emitting chip 110 may employ semiconductor materials according to wavelength of light. For example, the light-emitting chip 110 emits blue ultraviolet light, light, green light, red light, or yellow light.

The housing 130 is combined with the lead frame 120 to fix the lead frame 120. In detail, the housing 130 enwraps at least portions of the first and second lead terminals 122 and 124 to fix a position of the first and second lead terminals 122 and 124. The housing 130 includes, for example, polyphthalamide (PPA) resin, etc.

The housing 130 includes an opening portion 132 exposing the light-emitting chip 110 and a portion of the lead frame 120, on which the light-emitting chip 110 is mounted. The opening portion 132 may have, for example, an inverted truncated cone shape. In other words, the opening portion 132 may have a shape of which size increases along a direction from a lower portion adjacent to the lead frame 120 to an upper portion. Therefore, an inner side of the housing 130, which corresponds to the opening portion 132, is inclined, and the inner side of the housing 130 may have a light reflecting layer formed thereon.

The encapsulant 160 is filled in the opening portion 132 of the housing 130 to encapsulate the light-emitting chip 110. The encapsulant 160 protects the light-emitting chip 110. The encapsulant 160 includes, for example, optically transparent epoxy or silicone (or silicon resin). The encapsulant 160 may include fluorescent particles 162 distributed therein to change wavelength of light emitted by the light-emitting chip 110. For example, the encapsulant 160 includes, at least of red, green, and blue fluorescent particles to generate required colored light such as white light.

The LED 100 may emit white light through the light-emitting chip 110 and the fluorescent particles 162.

For example, the light-emitting chip 110 may emit blue light, and the fluorescent particles 162 may be yellow fluorescent particles changing portions of the blue light into yellow light to generate white light. In detail, the blue light generated by the light-emitting chip 110 may have a wavelength in a range of about 430 nm to about 470 nm, and the light-emitting chip 110 may include an InGaN semiconductor. The yellow fluorescent particles receive the blue light to emit yellow light. The yellow fluorescent particles may include, for example, yttrium aluminum garnet ($Y_3Al_5O_{12}$; or YAG) series, silicate series, and TAG series. Therefore, the LED 100 may generate white light in which the blue light emitted by the light-emitting chip 110 and the yellow light emitted by the yellow fluorescent particles mixed with each other.

Alternatively, the light-emitting chip 110 may generate blue light, and the fluorescent particles 162 may include red fluorescent particles converting blue light into red light, and green fluorescent particles converting blue light into green light. The red fluorescent particles may include, for example, inorganic substances having similar crystal structure to that of SrS:Eu, (Sr,Ca)S:Eu, CaS:Eu, (Sr,Ca)GeS:Eu and $CaAlSiN_3$, or solid solution. The green fluorescent particles may include, for example, $SrGa_2S_4$:Eu and $(Ba,Sr,Ca)_2SiO_4$:Eu, etc. Therefore, the LED 100 may generate white light in which the blue light generated by the light-emitting chip 110, the red light emitted by the red fluorescent particles, and the green light emitted by the green fluorescent particles are mixed with each other. As described above, when white color is generated by using the light-emitting chip 110 emitting blue light, the red fluorescent particles and the green fluorescent particles, the color reproducibility is enhanced to be in a range of about 90% to about 110%, which is about 20% improved in comparison with the white color generated by using the light-emitting chip 110 emitting blue light and yellow fluorescent particles, of which color reproducibility is about 85%.

Alternatively, the LED 100 may include two light-emitting chips 110 emitting different colored light and one kind of fluorescent particles 162. For example, the two light-emitting chips 110 may emit blue light and red light, respectively, and the fluorescent particles 162 may be green fluorescent particles converting the blue light emitted by the blue light-emitting chip into green light. Alternatively, the two light-emitting chips 110 may emit blue light and green light, respectively, and the fluorescent particles 162 may be red fluorescent particles converting the blue light or green light emitted by the blue light-emitting chip into red light.

According to the LED 100 having a structure described above, light emitted by the light-emitting chip 110 or the fluorescent particles 162 and advancing downward is reflected by the lead frame 120 to advance upward. In this case, by using the lead frame 120 including the light-reflecting layer 120b including silver (Ag) or aluminum (Al), and the protection layer 120c including gold (Au), nickel (Ni), or titanium (Ti) and formed on the light-reflecting layer 120b, the light reflectivity may be maintained to be over a specific level while preventing being corroded and darkened.

The lead frame 120 may be applied to various models, for example such as a top-view package, a side-view package, a lamp type package, a chip type package, etc.

Figure 7:
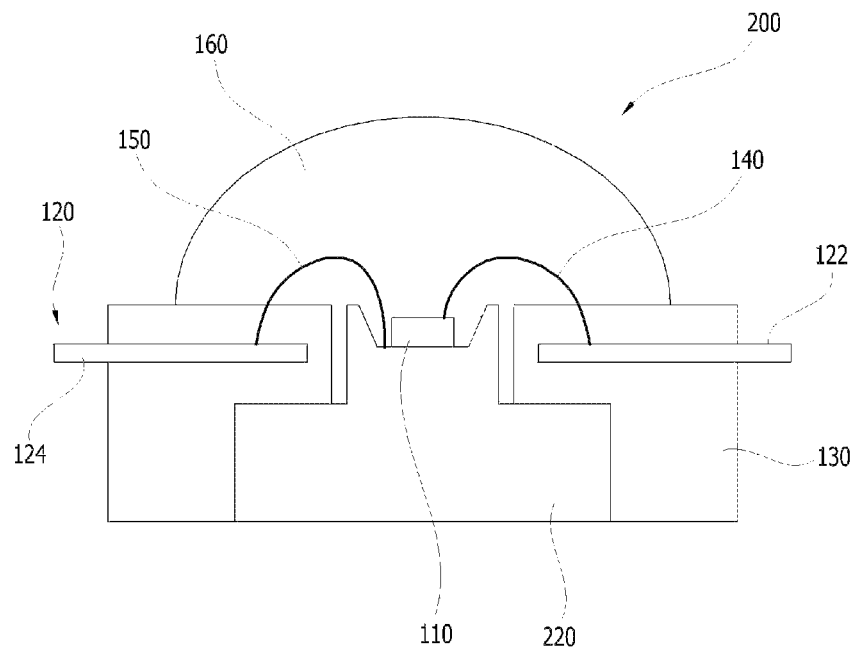
FIG. 7 is a cross-sectional view showing an LED according to another exemplary embodiment of the present invention.

FIG. 7 is a cross-sectional view showing an LED according to another exemplary embodiment of the present invention.

Referring to FIG. 7, an LED 200 according to another exemplary embodiment of the present invention includes a light-emitting chip 110, a metal member 220 on which the light-emitting chip 110 is mounted, lead frames 120 and 122 applying electric power to the light-emitting chip 110, and a housing 130 fixing the metal member 220 and the lead frame 120. The LED 200 may further include first and second conducting wires 140 and 150 electrically connecting the light-emitting chip 110 to the lead frame 120, and an encapsulant 160 encapsulating the light-emitting chip 110.

According to the present exemplary embodiment, the metal member 220, on which the light-emitting chip 110 is mounted, is a slug radiating heat generated by the light-emitting chip 110. For convenience, the same numeral will be used for the slug and the metal member 220. Furthermore, other elements except the slug 220 are substantially the same as the elements in FIG. 1 and FIG. 2. Thus, same reference numbers will be used for the same elements and any further explanation will be omitted.

The slug 220 is disposed at a center portion of the housing 130, and the light-emitting chip 110 is mounted on an upper portion of the slug 220. The lower portion of the slug 220 is exposed out of the housing 130 to enhance efficiency of heat radiation.

The slug 220 includes a base metal layer 120a, a light-reflecting layer 120b formed on the base metal layer 120a, and a protection layer 120c formed on the light-reflecting layer 120b to prevent the light-reflecting layer 120b from being corroded and darkened while maintaining high light reflectivity, substantially the same as the lead frame 120 in FIG. 3. For example, the light-reflecting layer 120b may include silver (Ag) or aluminum (Al), and the protection layer 120c may include gold (Au), nickel (Ni), or titanium (Ti). The slug 220 is substantially the same as the lead frame 120 in FIG. 3 except for a shape. Thus, any further explanation will be omitted.

Figure 8:
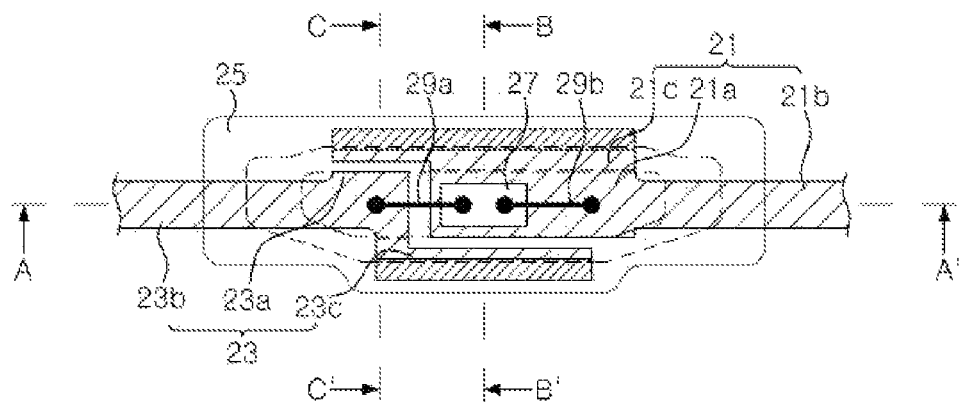
FIG. 8 is a plan view showing a portion of an LED according to still another exemplary embodiment of the present invention.
Figure 9:
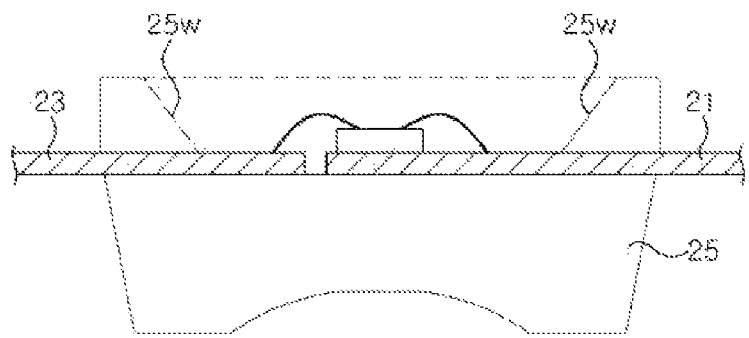
FIG. 9 is a cross-sectional view taken along line A-A' in FIG. 8.
Figure 10:
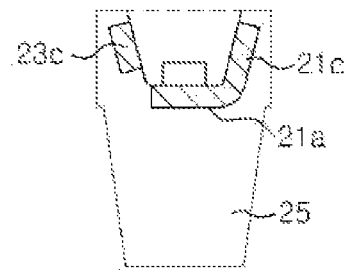
FIG. 10 is a cross-sectional view taken along line B-B' in FIG. 8.
Figure 11:
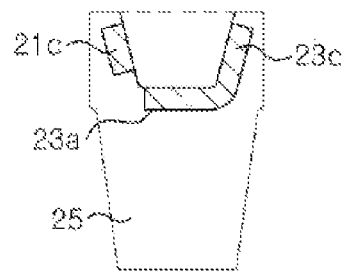
FIG. 11 is a cross-sectional view taken along line C-C' in FIG. 8.

FIG. 8 is a plan view showing a portion of an LED according to still another exemplary embodiment of the present invention. FIG. 9 is a cross-sectional view taken along line A-A' in FIG. 8, FIG. 10 is a cross-sectional view taken along line B-B' in FIG. 8, and FIG. 11 is a cross-sectional view taken along line C-C' in FIG. 8.

Referring to FIG. 8, FIG. 9, FIG. 10, and FIG. 11, an LED according to still another exemplary embodiment of the present invention includes a lead frame having a first lead terminal 21 and a second lead terminal 23. As shown in FIG. 3, the first and second lead terminals 21 and 23 may include, for example, a base metal layer, a light-reflecting layer including silver (Ag) or aluminum (Al) and formed on the base metal layer, and a protection layer including gold (Au), nickel (Ti), or titanium (Ti) and formed on the light-reflecting layer.

The first lead terminal 21 includes a chip-mounting portion 21a on which the light-emitting chip 27 is mounted, a first external lead portion 21b extended from the chip-mounting portion 21a to be disposed out of the housing 25, and a first wing portion 21c extended from the chip-mounting portion 21a. The second lead terminal 23 includes a wire bonding portion 23a, a second external lead portion 23b extended from the wire bonding portion 23a to be disposed out of the housing 25, and a second wing portion 23c extended from the wire bonding portion 23a. The first and second lead terminals 21 and 23 are spatially and electrically separated from each other. The first and second wing portions 21c and 23c are bent from the chip-mounting portion 21a and the wire bonding portion 23a, respectively to form a light-reflecting surface. The first and second wing portions 21c and 23c are disposed opposite to each other with respect to the chip-mounting portion 21a and in parallel with each other.

The first wing portion 21c may be extended to be disposed adjacent to a side of the wire bonding portion 23c of the second lead terminal 23. The first wing portion 21c may have a wider width than that of the second wing portion 23c as shown in FIG. 8, but the first wing portion 21c may have an equal width to the width of the second wing portion 23c or narrower width than that of the second wing portion 23c. For example, the second wing portion 23c may be extended to a portion of the first lead terminal 21, in which the chip-mounting portion 21a is connected to the first external lead portion 21b, so that the second wing portion 23c may have equal width to that of the first wing portion 21c or wider width than that of the first wing portion 21c.

The first and second wing portions 21c and 23c are bent from the chip-mounting portion 21a and the wire bonding portion 23a, respectively. The light-reflecting surface defined by the first and second wing portions 21c and 23c may be inclined with respect to the chip-mounting portion 21a or perpendicular to the chip-mounting portion 21a. The first and second wing portions 21c and 23c may be bent. Alternatively, the first and second wing portions 21c and 23c may be formed through various methods, for example, such as a press method, a welding method, etc.

The housing 25 is combined with the first and second lead terminals 21 and 23 to support the first and second lead terminals 21 and 23. The housing 25 may be formed through a molding method. In detail, the first and second lead terminals 21 and 23 are inserted in a molding cast and molding resin is injected into the molding cast to form the housing 25. The housing 25 encapsulates lower surfaces of the chip-mounting portion 21a and the wire bonding portion 23a. Additionally, the housing 25 may encapsulate outer surfaces of the first and second wing portions 21c and 23c. The outer surfaces of the first and second wing portions 21c and 23c may be entirely encapsulated by the housing 25. Alternatively, at least a portion of the outer surfaces of the first and second wing portions 21c and 23c may be exposed to an outside.

The housing 25 defines inner walls of the opening portion together with the first and second wing portions 21c and 23c. Especially, the housing 25 defines an inner wall 25w of the opening portion, which is substantially perpendicular to the light-reflecting surface defined by the first and second wing portions 21c and 23c. The inner wall 25w may be inclined. The chip-mounting portion 21a and the wire bonding portion 23a define a bottom surface of the opening portion.

The first and second lead terminals 21 and 23 include first and second external lead portions 21b and 23b exposed out of the housing 25 to be electrically connected to an external power source. The first and second external lead portions 21b and 23b may have various shapes and be bent to have various shapes.

The light-emitting chip 27 is mounted on the chip-mounting portion 21a of the first lead terminal 21, and electrically connected to the wire bonding portion 23a of the second lead terminal 23 through the first conducting wire 29a. Alternatively, the light-emitting chip 27 may be electrically connected to the first lead terminal 21 through the second conducting wire 29b or a conductive adhesive.

An encapsulant (not shown) including fluorescent particles distributed therein may be filled in the opening of the housing 25 to encapsulate the light-emitting chip 27. The encapsulant including fluorescent particles distributed therein was explained above in reference to FIG. 2. Thus, any further explanation will be omitted.

According to the present exemplary embodiment, the first wing portion 21c of the first lead terminal 21 and the second wing portion 23c of second lead terminal 23 define two inner walls of the opening portion, so that light reflectivity of the opening portion inner wall may be improved. Especially, in a side-view type LED having a linear opening portion, the first and second wing portions 21c and 23c are disposed along a major axis direction of the opening portion, so that an area of the light-reflecting surface defined by the first and second wing portions 21c and 23c may be increased. Furthermore, the first and second wing portions 21c and 23c reflect light advancing the housing 25 to prevent the housing 25 from discoloration. Additionally, heat transferred to the second wing portion 23c may be radiated through the second lead terminal 23. Therefore, heat radiation capacity of the LED may be improved since the second lead terminal 23 also radiates heat substantially the same as the first lead terminal 21.

Figure 12:
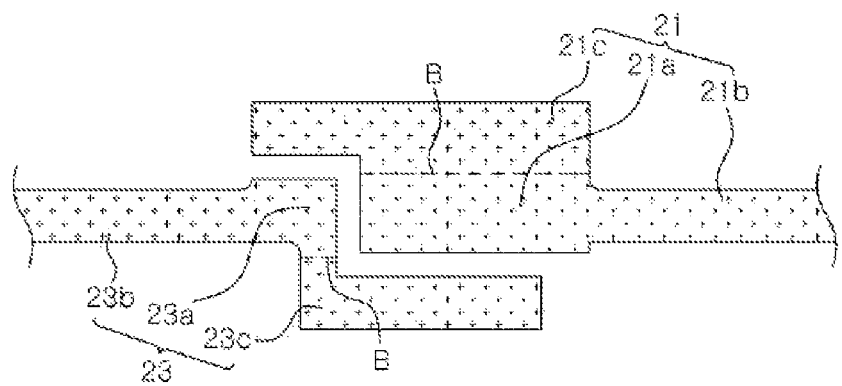
FIG. 12 is a plan view for showing a process of making first and second lead terminals according to an exemplary embodiment of the present invention.

FIG. 12 is a plan view for showing a process of making first and second lead terminals according to an exemplary embodiment of the present invention.

Referring to FIG. 12, a first lead terminal 21 and a second lead terminal 23 are formed by punching a flat metal plate. The first lead terminal 21 includes a chip-mounting portion 21a, a first external lead portion 21b and a first wing portion 21c. The first wing portion 21c is upwardly bent along a dotted line B to define a first light-reflecting surface. The second lead terminal 23 includes a wire bonding portion 23a, a second external lead portion 23b, and a second wing portion 23c. The second wing portion 23c is upwardly bent along a dotted line B to define a second light-reflecting surface. The first wing portion 21c may be extended along a side of the wire bonding portion 23a of the second lead terminal 23. The second wing portion 23c is terminated at a region adjacent to the chip-mounting portion 21a. However, the second wing portion 23c may be extended to a region in which the chip-mounting portion 21a is connected with the first external lead portion 21b.

The first and second lead terminals 21 and 23 may be formed through a casting method or a welding method. When the first and second lead terminals 21 and 23 are formed through a casting method or a welding method, an enfolding process of the first and second wing portions 21c and 23c may be omitted.

According to the present exemplary embodiment, the first and second lead terminals 21 and 23 have the first and second wing portions 21c and 23c with a rectangular shape, respectively. However, the shapes of the first and second wing portions 21c and 23c are not limited to the rectangular shape. That is, the shapes of the first and second wing portions 21c and 23c may be variously adjusted according to a shape of a package of an LED.

Figure 13:
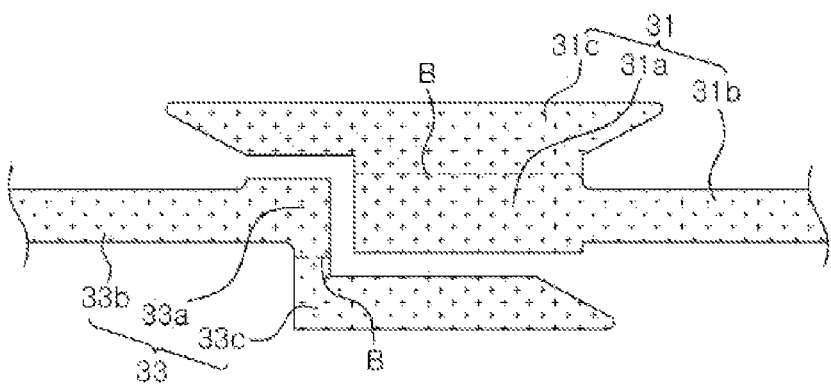
FIG. 13 is a plan view showing a lead frame according to another exemplary embodiment of the present invention.

FIG. 13 is a plan view showing a lead frame according to another exemplary embodiment of the present invention.

Referring to FIG. 13, a first lead terminal 31 includes a chip-mounting portion 31a, a first external lead portion 31b, and a first wing portion 31c, and a second lead terminal 33 includes a wire bonding portion 33a, a second external lead portion 33b, and a second wing portion 33c. The first and second wing portions 31c and 33c have a width increasing in a direction far away from the chip-mounting portion 31a and the wire bonding portion 33a, respectively. When the inner walls 25w of the opening portion are inclined as shown in FIG. 9, the first and second wing portions 31c and 33c have the increasing width to correspond to the shape of the inner walls 25w, so that the area of the light-reflecting surface is increased.

In the present exemplary embodiment, a side-view type LED having a linear opening portion is disclosed and explained. However, the present exemplary embodiment is not limited to the side-view type LED having a linear opening portion. The present exemplary embodiment may be applied to various packages employing a lead frame, a plastic housing, and having circular, rectangular opening portion, etc.

Figure 14:
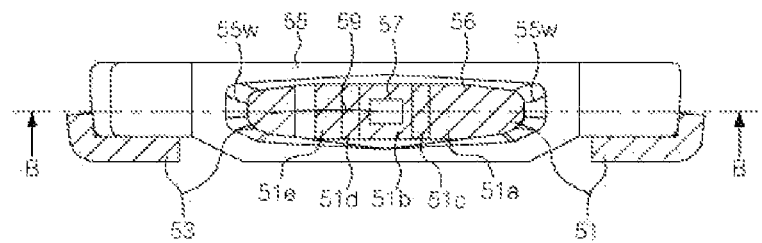
FIG. 14 is a plan view showing an LED according to still another exemplary embodiment of the present invention.
Figure 15:
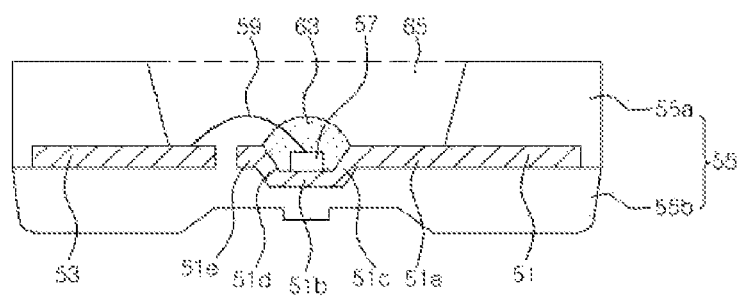
FIG. 15 is a cross-sectional view taken along line B-B in FIG. 14.
Figure 16A:
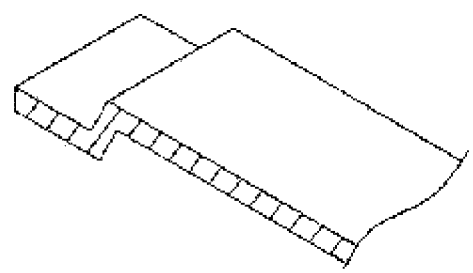
FIGS. 16A, 16B, and 16C are perspective views showing a portion of various first lead terminals applicable to an LED.
Figure 16B:
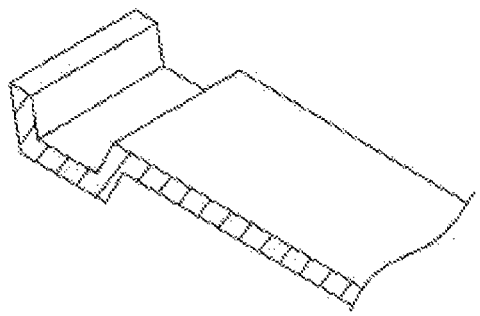
Figure 16C:
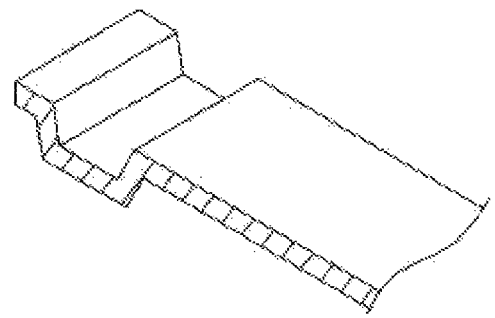
Figure 17:
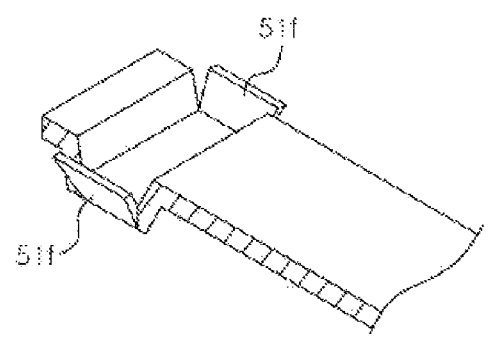
FIG. 17 is a perspective view showing a portion of a first lead terminal according to another exemplary embodiment of the present invention.

FIG. 14 is a plan view showing an LED according to still another exemplary embodiment of the present invention, and FIG. 15 is a cross-sectional view taken along line B-B in FIG. 14. FIG. 16A, FIG. 16B, and FIG. 16C are perspective views showing a portion of various first lead terminals applicable to an LED. FIG. 17 is a perspective view showing a portion of a first lead terminal according to another exemplary embodiment of the present invention.

Referring to FIG. 14 and FIG. 15, an LED includes a first lead terminal 51 and a second lead terminal 53. The first and second lead terminals 51 and 53 include a base metal layer, a light-reflecting layer including silver (Ag) or aluminum (Al), and gold (Au), and a protection layer including gold (Au), nickel (Ni), or titanium (Ti), as shown in FIG. 3.

The first lead terminal 51 includes a chip-mounting portion 51b on which a light-emitting chip 57 is mounted, a step portion 51a disposed to be lower than the chip-mounting portion 51b, and a first inclined portion 51c disposed between the chip-mounting portion 51b and the step portion 51a to define a light-reflecting surface (see FIG. 16A). The second lead terminal 53 is spaced apart from the first lead terminal 51. The second lead terminal 53 may be disposed at the same height as the step portion 51a of the first lead terminal 51.

The first lead terminal 51 may further include a second inclined portion 51d connected to the chip-mounting portion 51b to be disposed opposite to the first inclined portion 51c (see FIG. 16B). Additionally, the first lead terminal 51 may further include an end portion 51e extended from the second inclined portion 51d to be disposed at the same height as the step portion 51a (see FIG. 16C).

The first and second lead terminals 51 and 53 are supported by the housing 55. For convenience, the housing 55 is divided into an upper housing 55a and a lower housing 55b, which are disposed upper and lower portions with respect to the step portion 51a of the first lead terminal 51 and the second lead terminal 53.

The housing 55 may have an opening portion 56 exposing portions of the first and second lead terminals 51 and 53. The opening portion 56 exposes the chip-mounting portion 51b of the first lead terminal 51, the first and second inclined portions 51c and 51d, and a portion of the second lead terminal 53. Furthermore, the opening portion 56 may expose a portion of the step portion 51a of the first lead terminal 51.

The first and second lead terminals 51 and 53 are spaced apart from each other in the opening portion 56. The first and second lead terminals 51 and 53 are extended out of the housing 55 in order to be electrically connected to an external power source. The first and second lead terminals 51 and 53 extended out of the housing 55 may have various shapes and be bent variously.

The chip-mounting portion 51b of the first lead terminal 51 is disposed close to the lower housing 55b, so that a recessed portion is formed at a bottom surface of the opening portion 56. The first inclined portion 51c of the first lead terminal 51 crosses over a major axis direction of the opening portion 56. The first inclined portion 51c of the first lead terminal 51 may make contact with the inner wall of a minor axis direction of the housing 55 or be terminated before meeting the inner wall. That is, the first inclined portion 51c exposed through the opening portion 56 is not continuous but intermittent. Therefore, the light reflectivity of the major axis direction is improved without changing directivity of the minor axis direction, and it is possible to separately control light distribution of the major axis direction and the minor axis direction. Also, the second inclined portion 51d of the first lead terminal 51 crosses over the major axis direction of the opening portion 56. The second inclined portion 51d of the first lead terminal 51 may make contact with the inner wall of a minor axis direction of the housing 55 or be terminated before meeting the inner wall. The second inclined portion 51d is symmetric with first inclined portion 51c, so that light distribution becomes symmetric.

The light-emitting chip 57 is mounted on the chip-mounting portion 51b, and electrically connected to the second lead terminal 53 through the conducting wire 59. Light generated by the light-emitting chip 57 is reflected by the first and second inclined portions 51c and 51d, before arriving at the inner wall 55w of the housing 55. Therefore, efficiency of the LED is improved, since a portion of the light generated by the light-emitting chip 57 is reflected by the first and second inclined portion 51c and 51d of light reflectivity. Additionally, an amount of light advancing toward the inner wall of the housing 55 is decreased to reduce discoloration of the inner wall of the housing 55, so that a life span of the LED is improved.

Referring to FIG. 17, in order to improve the light reflectivity of the minor axis direction and prevent discoloration of the inner wall of the housing 55 in the minor axis, the first lead terminal 51 may further include wing portions 51f extended from the chip-mounting portion 51b along the minor axis direction of the opening portion 56. The wing portions 51f connected with the chip-mounting portion 51b is bent to form third and fourth inclined portions. Additionally, the wing portions 51f are separated from the first and second inclined portions 51c and 51d, so that the wing portions 51f may be bent to have different angle from that of the first and second inclined portions 51c and 51d. Therefore, reflectivity of the minor axis direction and reflectivity of the major axis direction may be separately controlled.

The encapsulant 63 including fluorescent particles distributed therein may be formed to encapsulate the light-emitting chip 57. The encapsulant 63 may be formed through dropping liquid resin including the fluorescent particles distributed therein onto the recessed portion of the chip-mounting portion 51b. Therefore, the encapsulant 63 confined in the recessed portion to have a convex shape is formed. The encapsulant 63 including fluorescent particles distributed therein was explained above in reference to FIG. 2. Thus, any further explanation will be omitted.

The encapsulant 63 may fill up with the opening portion 56. Alternatively, the encapsulant 63 may be confined only in the recessed portion, and the opening portion 56 may be filled up with a transparent molding part 65.

Figure 18A:
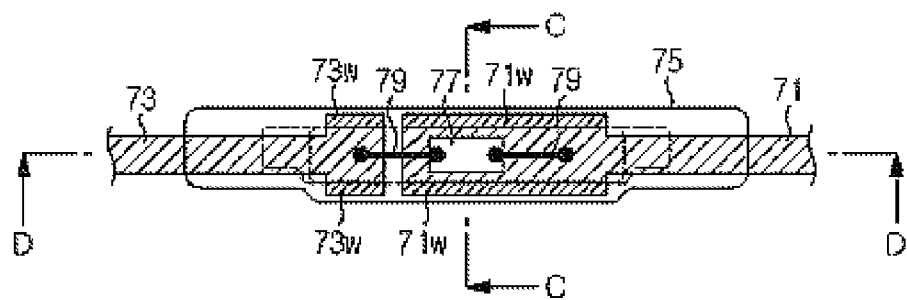
FIG. 18A is a plan view showing an LED according to still another exemplary embodiment of the present invention.
Figure 18B:
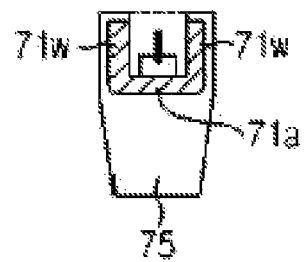
FIG. 18B is a cross-sectional view taken along line C-C in FIG. 18A.
Figure 18C:
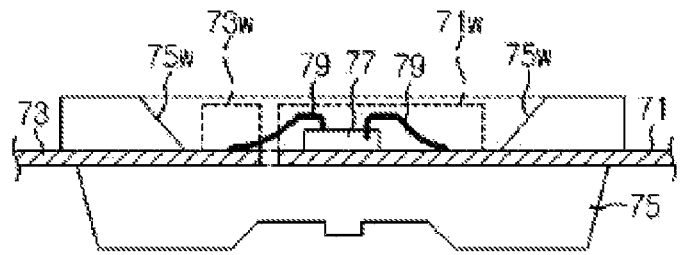
FIG. 18C is a cross-sectional view taken along line D-D in FIG. 18A.

FIG. 18A is a plan view showing an LED according to still another exemplary embodiment of the present invention. FIG. 18B is a cross-sectional view taken along line C-C in FIG. 18A, and FIG. 18C is a cross-sectional view taken along line D-D in FIG. 18A. In FIG. 18C, wing portions are expressed with a dotted line.

Referring to FIGS. 18A, FIG. 18B, and FIG. 18C, an LED according to the present exemplary embodiment includes a first lead terminal 71 and a second lead terminal 73.

The first and second lead terminals 71 and 73 include a base metal layer, a light-reflecting layer including silver (Ag) or aluminum (Al), and a protection layer including gold (Au), nickel (Ni) or titanium (Ti), as shown in FIG. 3.

The first lead terminal 71 includes a chip-mounting portion 71a on which a light-emitting chip 77 is mounted, and a first wing portions 71w upwardly extended from the chip-mounting portion 71a to define a light-reflecting surface. The second lead terminal 73 may include a wire bonding portion 73a, and a second wing portions 73w upwardly extended from the wire bonding portion 73a to define a light-reflecting surface. The first and second lead terminals 71 and 73 are spaced apart from each other, and the first and second wing portions 71w and 73w are disposed parallel with each other to define light-reflecting surfaces. The first and second wing portions 71w and 73w may be symmetric with respect to the chip-mounting portion 71a and the wire bonding portion 73a to obtain symmetrical light distribution. However, the first and second wing portions 71w and 73w have different widths than each other and are asymmetric.

The housing 75 is combined with the first and second lead terminals 71 and 73 to support the first and second lead terminals 71 and 73. The housing 75 covers a lower surface of the first and second lead terminals 71 and 73, and encapsulates outer surfaces of the first and second wing portions 71w and 73w. The housing 75 may fill up with a space between the chip-mounting portion 71a of the first lead terminal 71 and the wire bonding portion 73a of the second lead terminal 73, and a space between the first and second wing portions 71w and 73w. Additionally, the housing 75 may cover the upper surface of the first and second wing portions 71w and 73w.

The first and second lead terminals 71 and 73 are extended out of the housing 75 to be electrically connected to an external power source. The first and second lead terminals 71 and 73 may have various shapes, and may be bent in various ways.

The first and second wing portions 71w and 73w are disposed parallel with each other to define the light-reflecting surface, and the housing 75 may have an inner wall defining an opening portion with the first and second wing portions 71w and 73w. The housing 75 has inner walls 75w connecting the light-reflecting surface defined by the first and second wing portions 71w and 73w. The inner walls 75w may be inclined.

The light-emitting chip 77 is mounted on the chip-mounting portion 71a of the first lead terminal 71, and electrically connected to the second lead terminal 73 through the conducting wire 79. The light-emitting chip 77 may be electrically connected to the first lead terminal 71 and the second lead terminal 73 through two conducting wires 79, respectively. Alternatively, the light-emitting chip 77 may be electrically connected to the first lead terminal 71 through a conductive adhesive, and to the second lead terminal 73 through one conducting wire 79.

According to the present exemplary embodiment, the first and second lead terminals 71 and 73 are disposed at the bottom surface and both side surfaces of the opening portion, so that reflectivity of light generated by the light-emitting chip 77 may be improved. Especially, in a side-view type LED having a linear shaped opening portion, the first and second wing portions 71w and 73w are disposed along a major axis direction of the opening portion, so that an area of the light-reflecting surface may be increased. The first and second wing portions 71w and 73w reflect light advancing toward the housing 75 to decrease discoloration of the housing 75. Additionally, the first and second wing portions 71w and 73w radiate heat to improve heat radiating capacitance of the package. Furthermore, when the thickness of the housing 75 surrounding the outer surface of the first and second wing portions 71w and 73w is reduced, the housing 75 radiates heat more easily to improve heat-radiating ability.

Figure 19:
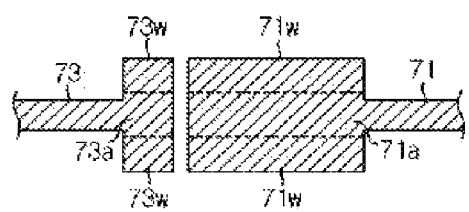
FIG. 19 is a plan view for showing a process of first and second lead terminals in FIGS. 18A, 18B, and 18C.

FIG. 19 is a plan view for showing a process of first and second lead terminals in FIGS. 18A, FIG. 18B, and FIG. 18C, and FIG. 20 is a plan view showing a process of first and second lead terminals according to another exemplary embodiment of the present invention.

Referring to FIG. 19, a first lead terminal 71 and a second lead terminal 73 are formed by punching or pressing a flat metal plate. The first lead terminal 71 includes a chip-mounting portion 71a and a first wing portion 71w extended from the chip-mounting portion 71a, and the second lead terminal 73 includes a wire bonding portion 73a and a second wing portion 73w extended from the wire bonding portion 73a. The first and second wing portions 71w and 73w are bent upward to define light-reflecting surfaces.

According to the present exemplary embodiment, the first and second lead terminals 71 and 73 have the first and second wing portions 71w and 73w with rectangular shape, but the shapes of the first and second wing portions 71w and 73w are not limited to the rectangular shape.

Figure 20:
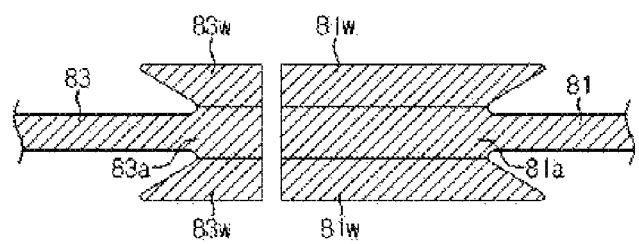
FIG. 20 is a plan view showing a process of first and second lead terminals according to another exemplary embodiment of the present invention.

Referring to FIG. 20, a first lead terminal 81 includes a chip-mounting portion 81a and a first wing portion 81w connected to the chip-mounting portion 81a, and a second lead terminal 83 includes a wire bonding portion 83a and a second wing portion 83w connected to the wire bonding portion 83a. The first and second wing portions 81w and 83w have a width increasing in a direction far away from the chip-mounting portion 81a and the wire bonding portion 83a, respectively. The first and second wing portions 81w and 83w having an increasing width corresponding to the inner walls 75w that are inclined. For example, when the inner walls 75w are inclined as shown in FIG. 18, an area of the light-reflecting surface increases along a longitudinal direction.

Figure 21A:
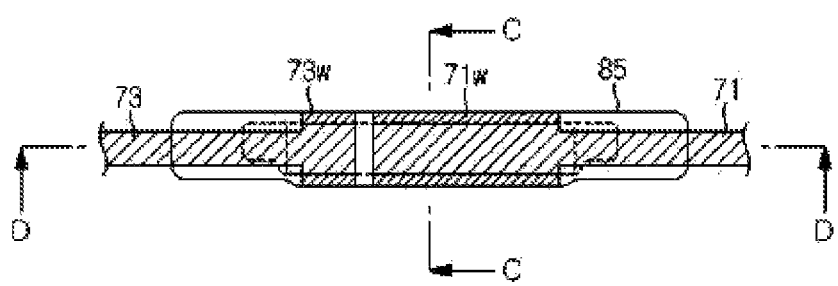
FIG. 21A is a plan view showing an LED according to still another exemplary embodiment of the present invention.
Figure 21B:
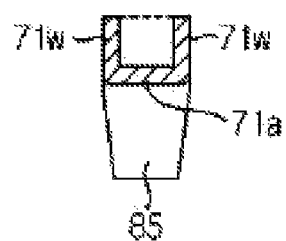
FIG. 21B is a cross-sectional view taken along line C-C in FIG. 21A.
Figure 21C:
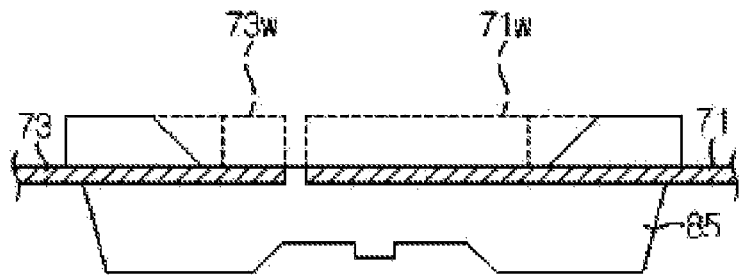
FIG. 21C is a cross-sectional view taken along line D-D in FIG. 21A.

FIG. 21A is a plan view showing an LED according to still another exemplary embodiment of the present invention. FIG. 21B is a cross-sectional view taken along line C-C in FIG. 21A, and FIG. 21C is a cross-sectional view taken along line D-D in FIG. 21A. In FIG. 21C, a wing portions is expressed with a dotted line. For convenience, a light-emitting chip and a conducting wire are omitted.

Referring to FIG. 21A, FIG. 21B, and FIG. 21C, an LED according to the present exemplary embodiment is substantially same as the LED in FIG. 18, except that an outer surface of first and second wing portions 71w and 73w are exposed out of the housing 85. That is, at least a portion of the outer surfaces of the first and second wing portions 71w and 73w is exposed. Therefore, heat generated from the LED may be easily radiated through the first and second wing portions 71w and 73w.

Figure 22A:
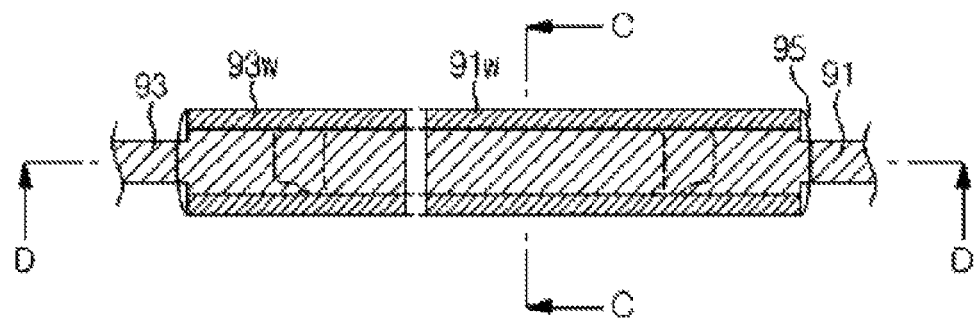
FIG. 22A is a plan view showing an LED according to still another exemplary embodiment of the present invention.
Figure 22B:
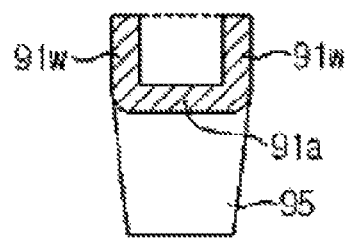
FIG. 22B is a cross-sectional view taken along line C-C in FIG. 22A.
Figure 22C:
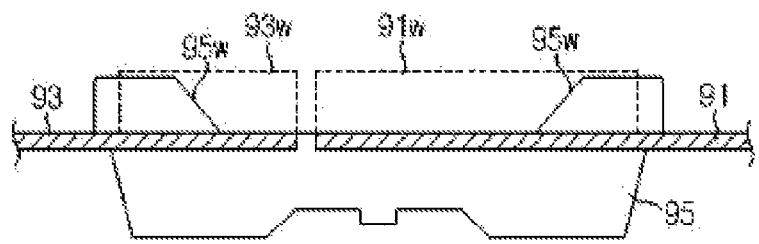
FIG. 22C is a cross-sectional view taken along line D-D in FIG. 22A.

FIG. 22A is a plan view showing an LED according to still another exemplary embodiment of the present invention. FIG. 22B is a cross-sectional view taken along line C-C in FIG. 22A, and FIG. 22C is a cross-sectional view taken along line D-D in FIG. 22A. In FIG. 22C, a wing portions are expressed with a dotted line. For convenience, a light-emitting chip and a conducting wire are omitted.

Referring to FIG. 22A, FIG. 22B, and FIG. 22C, an LED according to the present exemplary embodiment is substantially same as the LED in FIG. 18 except that a chip-mounting portion 91a of a first lead terminal 91, a wire bonding portion 93a of a second lead terminal 93, a first wing portion 91w and a second wing portions 93w are longer than corresponding elements in FIG. 18, and the first and second wing portions 91w and 93w occupy major portions of the side portion of the package. The housing 95 covers lower surfaces of the first and second lead terminals 91 and 93, and fills up with a space between the first and second lead terminals 91 and 93 to combine the first and second lead terminals 91 and 93. Additionally, the housing 95 has inner walls 95w connecting end portions of the first and second wing portions 91w and 93w operating as the light-reflecting surface. The inner walls 95w may be formed to be inclined.

According to the present exemplary embodiment, the width of the first and second wing portions 91w and 93w is increased to correspond to the width of the housing 95, so that heat radiation may be improved.

In the previous exemplary embodiments, a side-view type LED of which a package including a linear shaped opening portion was explained. However, the present exemplary embodiment is not limited to the above side-view type LED. The present exemplary embodiment may be applied to various type LEDs having a plastic housing, circular or rectangular opening portions, etc.

Figure 23:
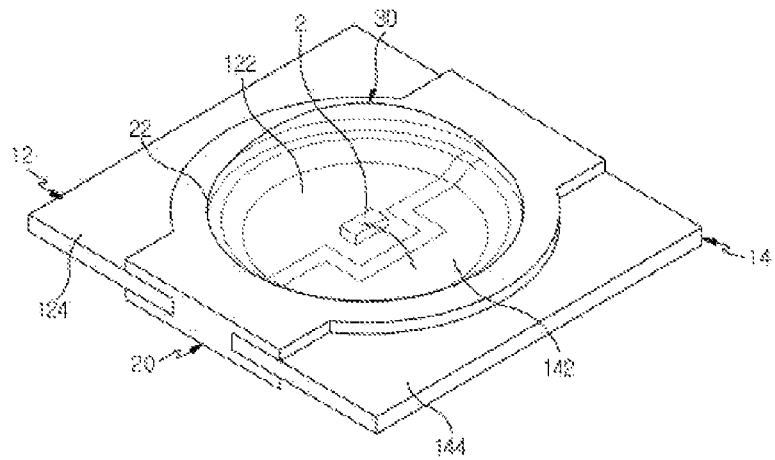
FIG. 23 is a perspective view showing an LED according to still another exemplary embodiment of the present invention.
Figure 24A:
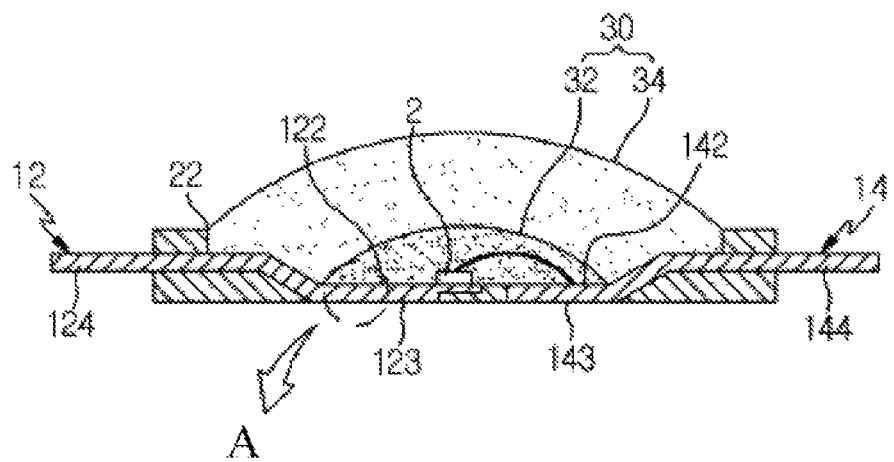
FIG. 24A is a cross-sectional view showing the LED in FIG. 23.

FIG. 23 is a perspective view showing an LED according to still another exemplary embodiment of the present invention. FIG. 24A is a cross-sectional view showing the LED in FIG. 23, and FIG. 24B is an enlarged view showing a portion A in FIG. 24A.

Figure 24B:
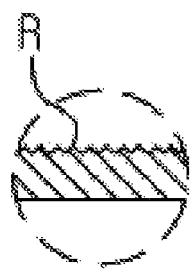
FIG. 24B is an enlarged view showing a portion A in FIG. 24A.

Referring to FIG. 23, FIG. 24A, and FIG. 24B, an LED according to the present exemplary embodiment includes a light-emitting chip 2, first lead and second lead terminals 12 and 14 applying electric power to the light-emitting chip 2, a housing 20 supporting the first and second lead terminals 12 and 14, and an encapsulant 30 which is optically transparent and protects the light-emitting chip 2.

The first and second lead terminals 12 and 14 include a base metal layer, a light-reflecting layer including silver (Ag) or aluminum (Al), and a protection layer including gold (Au), nickel (Ni), or titanium (Ti), as shown in FIG. 3.

The first and second lead terminals 12 and 14 have a plate-shape. The first and second lead terminals 12 and 14 are supported by the housing 30 in a state of being spaced apart from each other. The first and second lead terminals 12 and 14 include recessed portions 122 and 142 recessed to have the same depth. The recessed portion 122 of the first lead terminal 12 and the recessed portion 142 of the second lead terminals 14 form a cup on which the light-emitting chip 2 is mounted. A first gap between the first and second lead terminals 12 and 14, which is disposed at an outside of the cup, is greater than a second gap between the first and second lead terminals 12 and 14, which is disposed at inside of the gap, so that the housing 20 supports the first and second lead terminals 12 and 14 more tightly to improve durability.

The housing 20 covers portions of the first and second lead terminals 12 and 14, except for a bottom surface of the cup defined by the recessed portions 122 and 142. The bottom surfaces of the recessed portions 122 and 142, or the bottom surfaces 123 and 143 of the cup are exposed to an outside. Preferably, the bottom surfaces 123 and 143 of the cup are disposed in the same plane as the bottom surface of the housing 20. In this case, the bottom surfaces 123 and 143 of the cup may be electrically connected to an external printed circuit board to apply electric power to the light-emitting chip 2. The bottom surfaces 123 and 143 of the cup have a relatively thin thickness and large area and are exposed to improve heat radiation of the light-emitting chip 2.

The first and second lead terminals 12 and 14 include wing portions 124 and 144 extended from the recessed portions 122 and 142 to be disposed out of the housing 20, respectively. The wing portions 124 and 144 operate as a heat-radiating portion radiating heat generated by the light-emitting chip 2. The wing portions 124 and 144 have relatively a large area and are exposed to effectively radiate heat generated by the light-emitting chip 2. The wing portions 124 and 144 may be electrically connected to an external printed circuit board to apply electric power to the light-emitting chip 2. In this case, the bottom surface 123 and 143 of the cup radiates heat only.

The light-emitting chip 2 is mounted on the recessed portion 122 of the first lead terminal 12 and electrically connected to the first lead terminal 12. The light-emitting chip 2 is electrically connected to the recessed portion 142 of the second lead terminal 14 through a conducting wire.

The first and second lead terminals 12 and 14 include inclined portions connecting the bottom surface of the recessed portions 122 and 142 (or bottom surfaces 123 and 143 of the cup) to the wing portions 124 and 144. The inclined portions are flat with respect to the recessed portions 122 and 142 to reflect a portion of light emitted by the light-emitting chip 2 upward.

The first and second lead terminals 12 and 14 may have a rough surface R as shown in FIG. 24B. The rough surface R may be formed through a surface processing technology, for example, such as a sand blasting method. The rough surface R of the recessed portion 122 and 142 diffuses light to broaden directivity of light and improve efficiency of light. The rough surface R of the first and second lead terminals 12 and 14, which is disposed outside of the recessed portion 122 and 142 and covered by the housing 20, improves adhesive force between the housing 20 and the first and second lead terminals 12 and 14.

The cup defined by the recessed portions 122 and 142 may be filled up with an encapsulant 30 including optically transparent resin. For example, the encapsulant 30 may include a first encapsulating part 32 including silicone (or silicon resin), and a second encapsulating part 34 including epoxy resin or hard silicone (or silicon resin). At least one of the first and second encapsulating parts 32 and 34 may include fluorescent particles distributed therein.

Figure 25A:
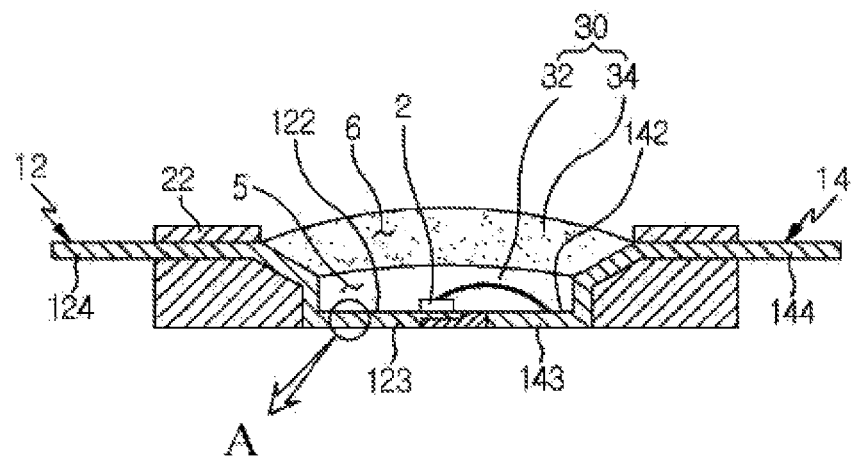
FIG. 25A is a cross-sectional view showing an LED according to still another exemplary embodiment of the present invention.
Figure 25B:
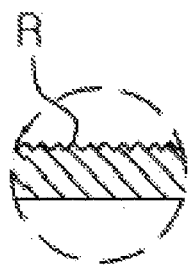
FIG. 25B is an enlarged view showing a portion A in FIG. 25A.

FIG. 25A is a cross-sectional view showing an LED according to still another exemplary embodiment of the present invention, and FIG. 25B is an enlarged view showing a portion A in FIG. 25A. An LED according to the present exemplary embodiment has substantially the same elements as the LED in FIG. 24 except vertical portions. Thus, the same reference numerals will be used to refer to the same elements in FIG. 24A and FIG. 24B, and any further explanation will be omitted.

Referring to FIG. 25A and FIG. 25B, the first and second lead terminals 12 and 14 include recessed portions 122 and 142 (or bottom surfaces 123 and 143 of a cup), vertical portions vertically extended from the recessed portions 122 and 142 to define a base portion 5 of the cup, inclined portions extended from the vertical portions to define an upper portion 6 of the cup, and wing portions 124 and 144 extended from the inclined portions.

Therefore, the cup includes the base portion 5 defined by the vertical portions and the recessed portions 122 and 142, and the upper portions defined by the inclined portions. The base portion 5 may make it easier to form a first encapsulating part 32.

Figure 26:
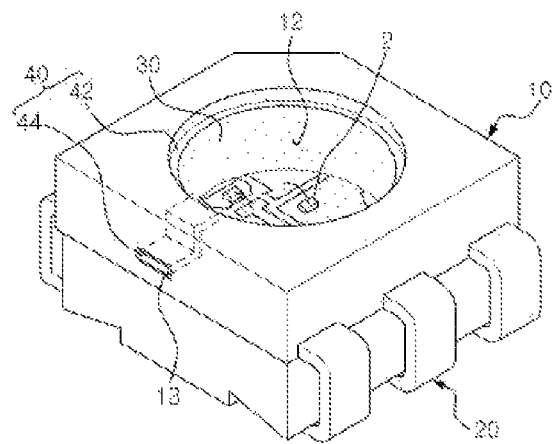
FIG. 26 is a perspective view showing an LED according to still another exemplary embodiment of the present invention.
Figure 27:
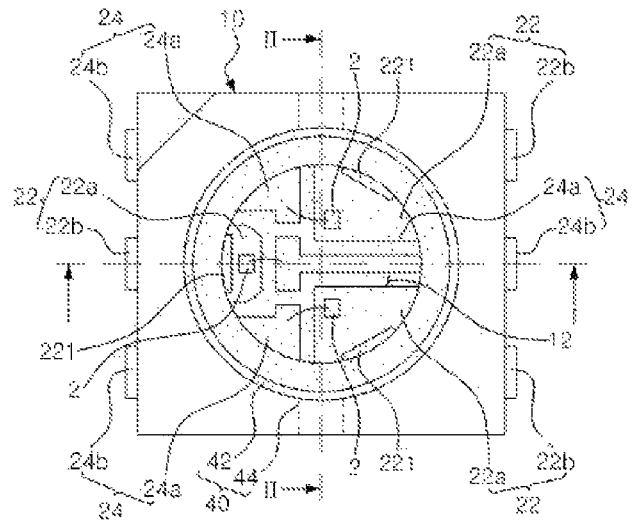
FIG. 27 is a plan view showing the LED in FIG. 26.

FIG. 26 is a perspective view showing an LED according to still another exemplary embodiment of the present invention. FIG. 27 is a plan view showing the LED in FIG. 26, and FIG. 28 is a cross-sectional view taken along line II-IF in FIG. 27.

Figure 28:
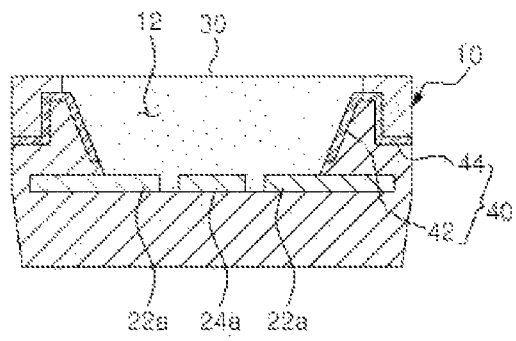
FIG. 28 is a cross-sectional view taken along line II-II' in FIG. 27.

Referring to FIG. 26, FIG. 27, and FIG. 28, an LED includes a light-emitting chip 2, a housing 10, a lead frame 20, an encapsulant 30, and a reflector 40.

The lead frame 20 may include six lead terminals 22 and 24. The six lead terminals 22 and 24 are supported by the housing 10. The lead frame 20 includes a base metal layer, a light-reflecting layer including silver (Ag) or aluminum (Al), and a protection layer including gold (Au), nickel (Ni), or titanium (Ti) as shown in FIG. 3.

The housing 10 is formed through a molding method using resin, and a center of an upper portion of the housing 10 has an opening portion 12 in which the light-emitting chip 2 is disposed. The housing 10 divides six lead terminals 22 and 24 into inner lead terminal 22a and 24a disposed inside of an opening portion 12, and outer lead terminal 22b and 24b disposed outside of the opening portion 12. The number of the lead terminals 22 and 24 of the lead frame 20 may be variously adjusted.

A light-emitting chip 2 is electrically connected to three lead terminals 22 of the lead frame 20 in a direct method, and three remaining lead terminals 24 through conductive wires.

The reflector 40 is formed to cover at least inner walls of the opening portion 12 of the housing 10. The reflector 40 may have the same material as the lead frame 20. That is, the reflector 40 may include a base metal layer, a light-reflecting layer including silver (Ag) or aluminum (Al), and a protection layer including gold (Au), nickel (Ni), or titanium (Ti) as shown in FIG. 3.

The reflector 40 and the lead frame 20 are supported by the housing 10. The reflector 40 may include light-reflecting portion 42 covering inner walls of the opening portion 12 having inverted truncated cone shape, and a heat-radiating portion 44 extended from the light-reflecting portion 42 to be disposed out of the housing 10.

The light-reflecting portion 42 is inclined, since the opening portion 12 has an inverted truncated cone shape in which an upper diameter is greater than a lower diameter. The shape of the light-reflecting portion 42 corresponds to the inner walls of the opening portion 12 of the housing 10. Therefore, the light-reflecting portion 42 makes contact with the inner wall of the opening portion 12.

The heat-radiating portion 44 is extended from the light-reflecting portion 42 to be exposed out of the housing 10. For example, the heat-radiating portion 44 is extended from an upper end portion of the light-reflecting portion 42 to a side of the housing 10. The housing 10 may include a heat-radiating hole 13 formed at a side of the housing.

When the number of the heat-radiating portions 44 increases, heat-radiating characteristics of the LED may be improved. The heat-radiating portion 44 has a strip shape extended from a portion of a circumference of an upper portion of the light-reflecting portion 42. Alternatively, the heat-radiating portion 44 may be extended from a portion of a circumference of a lower portion or the inner wall between the upper and lower portions. Furthermore, the heat-radiating portion 44 may have a torus shape extended from the entire circumference of the light-reflecting portion 42.

As long as the reflector 40 surrounds the opening portion 12 of the housing 10, the reflector 40 may have various shapes.

Figure 29:
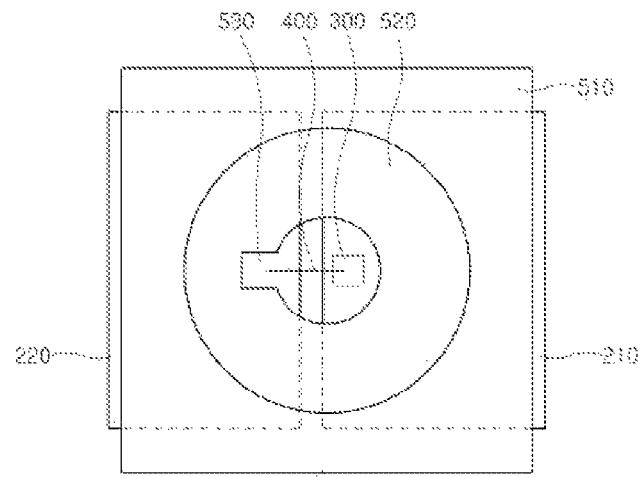
FIG. 29 is a plan view showing an LED according to still another exemplary embodiment of the present invention.
Figure 30:
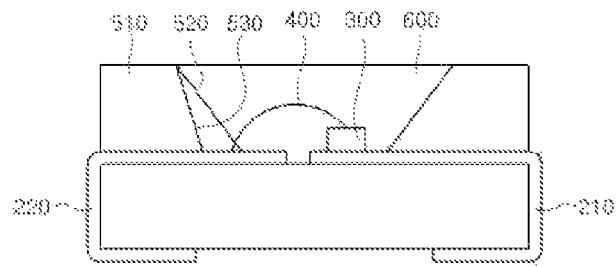
FIG. 30 is a cross-sectional view showing the LED in FIG. 29.

FIG. 29 is a plan view showing an LED according to still another exemplary embodiment of the present invention, and FIG. 30 is a cross-sectional view showing the LED in FIG. 29.

Referring to FIG. 29 and FIG. 30, an LED includes a lead frame having first and second lead terminals 210 and 220, a light-emitting chip 300, a conducting wire 400, a housing 510 and an encapsulant 600.

The first and second lead terminals 210 and 220 apply electric power to the light-emitting chip 300. The first and second lead terminals 210 and 220 include a base metal layer, a light-reflecting layer including silver (Ag) or aluminum (Al), and a protection layer including gold (Au), nickel (Ni), or titanium (Ti).

The light-emitting chip 300 is mounted on the first lead terminal 210, and electrically connected to the second lead terminal 220 through the conducting wire 400.

The housing 510 has an opening portion 520 for exposing the light-emitting chip 300 and portions of the first lead terminal 210 and second lead terminal 220. The opening portion 520 may have an inverted truncated cone shape. That is, the opening portion 520 has a decreasing size along a direction from an upper portion of the housing 510 to a lower portion of the housing 510.

Additionally, the housing 510 includes a cleavage portion 530 for exposing a wire bonding region. For example, a portion of the opening portion 520 is depressed to form the cleavage portion 530. The cleavage portion 530 is formed at a region of the opening portion 520, which exposes a portion of the second lead terminal 220 so that the light-emitting chip 300 is electrically connected to the portion of the second lead terminal 220 through a wire 400. In detail, the light-emitting chip 300 is mounted on the first lead terminal 210, and electrically connected to the first lead terminal 210 by making contact with the first lead terminal 210, and the light-emitting chip 300 is electrically connected to the second lead terminal 220 exposed through the cleavage portion 530 which is formed by recessing a portion of the opening portion 520 of the housing 510.

The shape and size of the wire bonding region of the second lead terminal 220 may be adjusted, considering the shape and size of the cleavage portion 530. When the number of the conducting wire 400 is more than one, or the number of the light-emitting chip 300 is more than one, the number of the cleavage portion 530 may be plural, corresponding to the number of the conducting wire 400.

The encapsulant 600 fills the opening portion 520 of the housing 510 and the cleavage portion 530 to protect the light-emitting chip 300.

Not shown in the FIG. 29 and FIG. 30, the reflector may be formed on the inner wall of the opening portion 520 and cleavage portion 530.

As described above, when the cleavage portion 530 for wire bonding is formed at a portion of the housing 510, the size of the housing 510 may be reduced, while securing a space for wire bonding to minimize defects of the wire bonding.

Figure 31:
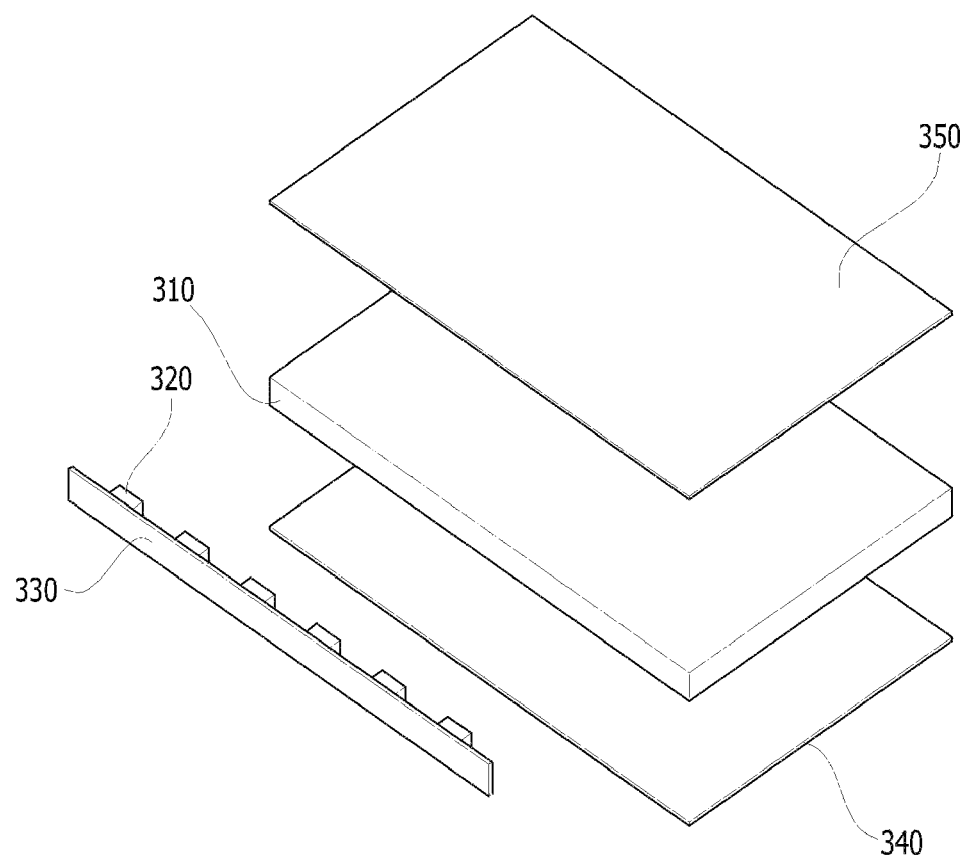
FIG. 31 is an exploded perspective view showing a backlight unit according to an exemplary embodiment of the present invention.

FIG. 31 is an exploded perspective view showing a backlight unit according to an exemplary embodiment of the present invention.

Referring to FIG. 31, a backlight unit according to an exemplary embodiment of the present invention includes a light guide plate 310 and at least one LED 320 disposed adjacent to the light guide plate 310 to provide the light guide plate 310 with light.

The LED 320 may be mounted on a circuit board 330 such as a printed circuit board (PCB) or a flexible printed circuit board FPCB. For example, a plurality of LEDs 320 is arranged along a longitudinal direction of the circuit board 330 with uniform distance. The LEDs 320 emit light with the LEDs 320 to receive electric power through the circuit board 330.

The LEDs 320 may be one in FIGS. 1 through 30. Therefore, any further explanations regarding to the LEDs 320 will be omitted.

The light guide plate 310 receives light generated by the LEDs 320 through a side surface and emits the light toward a liquid crystal display (LCD) panel disposed over the backlight unit. Preferably, the light guide plate 310 includes optically transparent material in order to minimize light loss. The light guide plate 310 may include, for example, polymethyl methacrylate (PMMA) or polycarbonate (PC).

The light guide plate 310 may have light-reflecting patterns (not shown) formed on a lower surface of the light guide plate 310. For example, the light-reflecting patterns formed on a lower surface of the light guide plate 310 may be printed patterns or embossing patterns. Therefore, light entering the light guide plate 310 from the LED 320 may be diffusively reflected by the light-reflecting pattern, and portions of the lights arrive at an upper surface of the light guide plate 310 with an angle smaller than the critical angle with respect to a normal line of the upper surface exit the light guide plate 310 through the upper surface of the light guide plate 310.

The light guide plate 310 may have uniform thickness. That is, an incident surface of the light guide plate 310, through which light generated by the LED 320 enters the light guide plate 310, may have the same width as an opposite surface of the incident surface. Alternatively, the light guide plate 310 may have a wedge shape having decreasing thickness in a direction from the light incident surface to the opposite surface.

The backlight unit may further include a light-reflecting sheet 340 disposed under the light guide plate 310. The light-reflecting sheet 340 reflects light that leaks out from the light guide plate 310 through the lower surface toward the light guide plate 310 to enhance light-using efficiency. The light-reflecting sheet 340 may include white-colored polyethylene terephthalate (PET) or polycarbonate (PC).

The backlight unit may further include optical sheets 350 disposed over the light guide plate 310. The optical sheets 350 may include at least one of a light-diffusing sheet diffusing light to enhance luminance uniformity, a light-condensing sheet enhancing front-view luminance, and a reflective polarization sheet enhancing luminance by recycling of light.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A lead frame, comprising:
a first lead terminal and a second lead terminal spaced apart from each other, each of the first lead terminal and the second lead terminal comprising:
a base metal layer;
a light-reflecting layer arranged directly on the base metal layer; and
a protection layer arranged directly on the light-reflecting layer and comprising a metal,
wherein the protection layer is the outermost layer of the lead frame, and
wherein the first lead terminal and the second lead terminal are configured to apply electric power to a light emitting chip.

2. The lead frame of claim 1, wherein the light-reflecting layer comprises silver (Ag) or aluminum (Al).

3. The lead frame of claim 1, wherein the protection layer comprises gold (Au), nickel (Ni), or titanium (Ti).

4. The lead frame of claim 3, wherein the protection layer comprises gold (Au) and is 0.1 nm to 600 nm thick.

5. The lead frame of claim 3, wherein the protection layer comprises nickel (Ni) or titanium (Ti) and is 0.1 nm to 20 nm thick.

6. The lead frame of claim 1, further comprising a nickel layer arranged between the base metal layer and the light-reflecting layer.

7. The lead frame of claim 6, wherein the nickel layer is arranged directly on the base metal layer, the light-reflecting layer is arranged directly on the nickel layer, and the protection layer is arranged directly on the light-reflecting layer.

8. The lead frame of claim 1, wherein the base metal layer comprises Cu.

9. The lead frame of claim 1, wherein the thickness of the base metal layer is about 0.1 mm to 1.0 mm.

10. A backlight unit, comprising:
a light guide plate; and
at least one light emitting diode (LED) to provide the light guide plate with light, wherein the at least one LED comprises:
a lead frame comprising a base metal layer, a light-reflecting layer arranged directly on the base metal layer, and a protection layer arranged directly on the light-reflecting layer and comprising a metal; and
a light-emitting chip arranged on the lead frame,
wherein the protection layer is the outermost layer of the lead frame.

11. The backlight unit of claim 10, wherein the light-reflecting layer comprises silver (Ag) or aluminum (Al).

12. The backlight unit of claim 10, wherein the protection layer comprises gold (Au), nickel (Ni), or titanium (Ti).

13. The backlight unit of claim 10, wherein the base metal layer comprises Cu.

14. The backlight unit of claim 10, wherein the thickness of the base metal layer is about 0.1 mm to 1.0 mm.

15. A lead frame, comprising:
a base metal layer;
a light-reflecting layer arranged on the base metal layer; and
a protection layer arranged on the light-reflecting layer and comprising a metal,
wherein the light-reflecting layer and the protection layer are arranged on a first side of the base metal layer and a second side of the base metal layer opposite to the first side, and
wherein the protection layer is the outermost layer of the lead frame.

16. A lead frame, comprising:
a first lead terminal and a second lead terminal spaced apart from each other, each of the first lead terminal and the second lead terminal comprising:
a base metal layer;
a light-reflecting layer arranged on the base metal layer; and
a protection layer arranged on the light-reflecting layer and comprising a metal,
wherein the light-reflecting layer and the protection layer are arranged on the entire length of the base metal layer, and
wherein the protection layer is the outermost layer of the lead frame, and
wherein the first lead terminal and the second lead terminal are configured to apply electric power to a light emitting chip.

17. A backlight unit, comprising:
a light guide plate; and
at least one light emitting diode (LED) to provide the light guide plate with light, wherein the at least one LED comprises:
a lead frame comprising a base metal layer, a light-reflecting layer arranged on the base metal layer, and a protection layer arranged on the light-reflecting layer and comprising a metal, wherein the light-reflecting layer and the protection layer are arranged on a first side of the base metal layer and a second side of the base metal layer opposite to the first side; and
a light-emitting chip arranged on the lead frame,
wherein the protection layer is the outermost layer of the lead frame.

18. A backlight unit, comprising:
a light guide plate; and
at least one light emitting diode (LED) to provide the light guide plate with light, wherein the at least one LED comprises:
a lead frame comprising a base metal layer, a light-reflecting layer arranged on the base metal layer, and a protection layer arranged on the light-reflecting layer and comprising a metal,
wherein the light-reflecting layer and the protection layer are arranged on the entire length of the base metal layer,
wherein a light-emitting chip is arranged on the lead frame, and
wherein the protection layer is the outermost layer of the lead frame.

* * * * *